(12) United States Patent
Oman

(10) Patent No.: US 7,030,317 B1
(45) Date of Patent: Apr. 18, 2006

(54) ELECTRONIC ASSEMBLY WITH STACKED INTEGRATED CIRCUIT DIE

(75) Inventor: Todd P. Oman, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 110 days.

(21) Appl. No.: 11/105,317

(22) Filed: Apr. 13, 2005

(51) Int. Cl.
*H01L 23/02* (2006.01)

(52) U.S. Cl. ............... 174/52.4; 257/777; 257/778; 257/713

(58) Field of Classification Search ........... 174/52.2, 174/52.4; 257/777, 778, 713
See application file for complete search history.

(56) References Cited

U.S. PATENT DOCUMENTS

| | | | | |
|---|---|---|---|---|
| 6,150,724 A | * | 11/2000 | Wenzel et al. | 257/777 |
| 6,291,881 B1 | * | 9/2001 | Yang | 257/723 |
| 6,507,098 B1 | * | 1/2003 | Lo et al. | 257/686 |
| 6,559,525 B1 | * | 5/2003 | Huang | 257/675 |
| 6,590,281 B1 | * | 7/2003 | Wu et al. | 257/684 |
| 6,650,006 B1 | * | 11/2003 | Huang et al. | 257/686 |
| 6,707,140 B1 | * | 3/2004 | Nguyen et al. | 257/686 |

* cited by examiner

*Primary Examiner*—Hung V. Ngo
(74) *Attorney, Agent, or Firm*—Stefan V. Chmielewski

(57) ABSTRACT

An electronic assembly with a plurality of stacked integrated circuit (IC) die includes a base substrate, a first IC die, a second IC die, a signal routing first interconnect and a signal routing second interconnect. The first interconnect is partially positioned between the first and second IC dies. The second interconnect is partially positioned adjacent the first side of the second IC die. The first interconnect couples a first contact of the first IC die to a first trace of the base substrate and a second contact of the second IC die to a second trace of the base substrate. The first and second interconnects, in combination, couple the first contact of the second IC die to the first trace.

19 Claims, 2 Drawing Sheets

ELECTRONIC ASSEMBLY WITH STACKED INTEGRATED CIRCUIT DIE

TECHNICAL FIELD

The present invention is generally directed to an electronic assembly and, more specifically, to an electronic assembly with stacked integrated circuit die.

BACKGROUND OF THE INVENTION

Today, electronic assemblies frequently implement integrated circuit (IC) die, e.g., flip-chips, that require electrical connection to both sides of the die. Due to relatively high power dissipation, many electronic assemblies also require top-side heatsinking of the die. Commercially available electronic assemblies that have included relatively high-power die have generally been deficient in removing heat from the die or have exhibited undesirable electrical characteristics, due to an implemented conductor scheme for routing signals between a substrate and one of the die and between the stacked die. One prior art electronic assembly has used a direct chip attach (DCA) with wirebonds, which tend to interfere with top-side heatsinking. Furthermore, packaged die, such as BGA, DPAK, D2PAK, TO-220, QFN and S08 packages, have not routed signals between die and electrically insulative layers implemented in such packages have exhibited a relatively high thermal resistance.

What is needed is an effective signal routing technique for an electronic assembly that implements top-side heatsinking of stacked integrated circuit (IC) die. It would be desirable for the technique to readily facilitate signal routing, between a substrate and the die and between the stacked die, while efficiently removing excessive heat from the electronic assembly.

SUMMARY OF THE INVENTION

The present invention is generally directed to an electronic assembly with a plurality of stacked integrated circuit (IC) die. In one embodiment, the assembly includes a base substrate, a first IC die, a second IC die, a signal routing first interconnect and a signal routing second interconnect. The base substrate includes an electrically conductive first trace and an electrically conductive second trace formed on a first surface of the base substrate. The first IC die has a first side and a second side, opposite the first side. The first side of the first IC die includes an electrically conductive first contact and the second side of the first IC die includes an electrically conductive second contact. The second contact of the first IC die is coupled to the second trace.

The second die includes a first side and a second side opposite the first side. The first side of the second IC die includes another electrically conductive first contact and the second side of the second IC die includes another electrically conductive second contact. The first interconnect is partially positioned between the first and second IC dies. The second interconnect is partially positioned adjacent the first side of the second IC die. The first interconnect couples the first contact of the first die to the first trace and the second contact of the second die to the second trace. The first and second interconnects, in combination, couple the first contact of the second die to the first trace.

According to another aspect of the present invention, the first and second IC die are field-effect transistors (FETs), insulated-gate bipolar transistors (IGBTs) or power flip-chips. According to another embodiment, the assembly further comprises a case that provides an enclosure for the base substrate, the first and second IC dies and the first and second interconnects. According to a different aspect of the present invention, the case includes an integrated heatsink. In this embodiment, the base substrate is in thermal contact with a portion of the case and the second interconnect is in thermal contact with the heatsink. The first and second interconnects provide a thermal path between the case and the first and second IC dies.

According to a different embodiment of the present invention, the first interconnect includes an electrically non-conductive first substrate having a first side and a second side, opposite the first side. In this embodiment, a first conductor is formed on the first side of the first substrate and a second conductor is formed on the second side of the first substrate. The second conductor is coupled to a via that provides the second conductor to the first side of the first substrate. Conductive elements extend from the first side of the first substrate to couple the first and second conductors of the first substrate to the first and second traces of the base substrate.

According to a different aspect of the present invention, the second interconnect includes an electrically non-conductive second substrate having a first side and a second side, opposite the first side. In this embodiment, a first conductor is formed on the first side of the second substrate and a second conductive layer is formed on the second side of the second substrate. Additionally, another conductive element extends from the first side of the second substrate to couple the first conductor of the second substrate to the first conductor of the first interconnect.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1A:
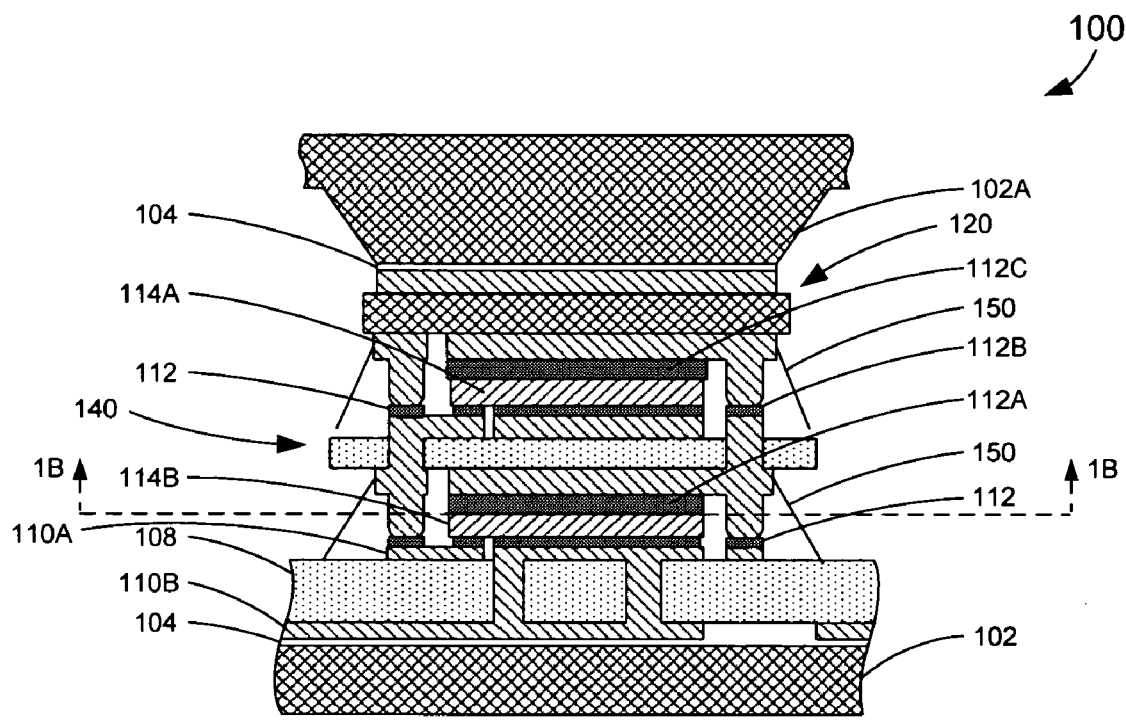
FIG. 1A is a cross-sectional view of a relevant portion of an electronic assembly, configured according to one embodiment of the present invention.

Various embodiments of the present invention are generally directed to a technique for electrically connecting stacked integrated circuit (IC) dies to a substrate, where connections to both sides of the IC dies and top-side heatsinking are desired. According to the present invention, a relatively low-resistance thermal path is provided to facilitate the stacking of dies that exhibits relatively high-power dissipation. An electronic assembly manufactured according to the present invention provides an electrically isolated assembly that readily facilitates top-side heatsinking. The assembly provides a relatively large pedestal bond surface for distributing current and providing improved heat dissipation. Additionally, the use of appropriate materials for a signal routing interconnect substrate facilitates complex routing of conductors. Furthermore, by choosing an appropriate insulative material for the interconnect substrate, improved thermal performance of the electronic assembly can be achieved.

An electronic assembly, configured according to various embodiments of the present invention, exhibits improved electrical and thermal performance, in that the signal routing interconnects provide relatively short electrical interconnects between IC dies and facilitate improved heat removal. When the IC dies are field-effect transistors (FETs), the on-impedance and inductance of the assembly are measurably reduced. An electronic assembly built according to one embodiment of the present invention provides improved electromagnetic interference (EMI) performance, as one or more of the signal routing interconnects may provide a large metal plate, e.g., a copper ground plane, for EMI shielding. Further, an electronic assembly, constructed according to the present invention, has a reduced footprint, e.g., approaching the footprint of a CSP, due to vertical integration of the assembly.

Additionally, an electronic assembly, constructed according to the present invention, exhibits reduced die solder joint stress, as the electrical insulators used in the signal routing interconnects may include materials that have a coefficient of thermal expansion (CTE) selected to match differences in the CTEs between the various components of the assembly. The present invention uses standard assembly processes and, as constructed in one embodiment, provides a self-aligning capability. The assembly also provides controlled die solder joint thickness (due to the elements that extend from a surface of the interconnects), with controlled lead heights. Finally, the electronic assembly has a reduced process time, as compared to many prior art electronic assemblies, as wirebonding of the die is not required.

It should be appreciated that while the discussion herein is directed toward a stack of two dies, the present invention is generally applicable to an electronic assembly that includes more than two stacked dies. The present invention is particularly beneficial when implemented with electronic assemblies that stack multiple field-effect transistors (FETs), insulated-gate bipolar transistors (IGBTs) and power flip-chips.

According to the present invention, a plurality of stacked power IC die contacts (signal routing interconnects) are utilized within an electronic assembly to provide signal routing between a substrate and a die and between dies. It should be appreciated that a signal routing interconnect substrate may be made of a variety of materials, such as silicon nitride (SiN), aluminum nitride (AlN), etc. The signal routing interconnects may include copper balls or other shapes (i.e., conductive elements) that are brazed to a contact of the interconnect to facilitate electrical interconnection to the substrate for the bottom die and between the interconnects for the stacked die. For all of the interconnects, except the interconnect closest the heatsink, metalized vias route the signals through the interconnect substrate material, facilitating the stacking of the dies.

As is mentioned above, the coefficient of thermal expansion (CTE) of the interconnect substrate can be varied. It should be appreciated that increasing the thickness of the conductor of the interconnect increases the CTE of the interconnect, while increasing the thickness of the substrate material reduces the CTE of the interconnect to more closely match the CTE of the die. This, in turn, reduces the stress on the solder joints of the die. Depending upon the environmental conditions that the electronic assembly is to be exposed to, an epoxy underfill may be utilized to further reduce stress on the solder joints of the die. An electronic assembly, constructed according to the present invention, with three stacked dies measuring 0.15 inch by 0.15 inch, exhibits about 3.7C/W of resistance from the bottom die to the upper heatsink.

With reference to FIG. 1A, an electronic assembly 100 includes a case 102 that has an integrated top-side heatsink 102A. If desired, a finned heatsink may also be incorporated within the assembly 100. As is shown, a base substrate 108, e.g., a printed circuit board (PCB), includes a plurality of traces 110A formed on a first surface of the substrate 108 and a plurality of traces 110B formed on a second surface of the substrate 108. A thermal grease 104 may be located between a lower portion of the case 102 and the second surface of the substrate 108 and between an upper portion of signal routing interconnect 120 and the heatsink 102A. Electrical contacts (e.g., a gate and a source) on a first side of an integrated circuit (IC) die 114B, e.g., a field-effect transistor (FET), an insulated-gate bipolar transistor (IGBT) or a power flip-chip, are electrically coupled directly to traces 110A formed on the substrate 108, via a plurality of solder joints 112. An electrical contact (e.g., a drain) on a second side of a die 114B is electrically connected to a conductor of signal routing interconnect 140, via a solder joint 112A.

Figure 1B:
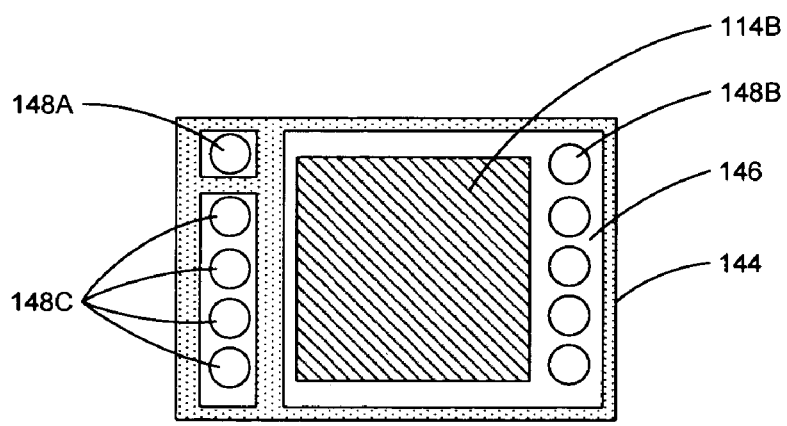
FIG. 1B is a bottom view of a cross-section of the electronic assembly of FIG. 1A, along line 1B—1B.
Figure 2A:
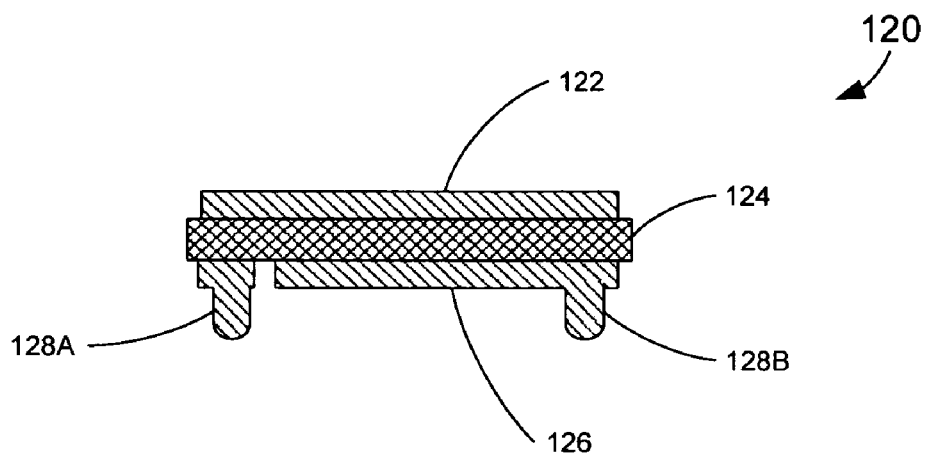
FIG. 2A is a cross-sectional view of a signal routing interconnect, constructed according to one embodiment of the present invention.
Figure 2B:
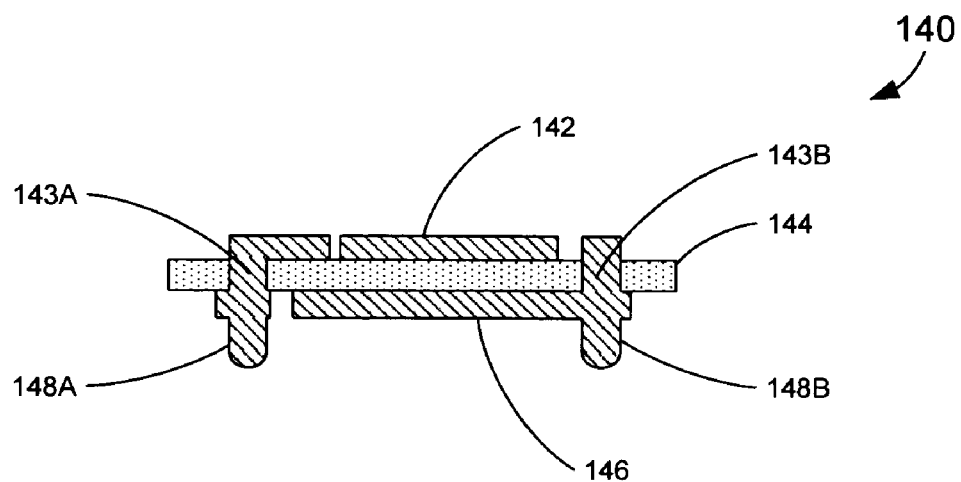
FIG. 2B is a cross-sectional view of a signal routing interconnect, constructed according to another embodiment of the present invention.

As is best shown in FIG. 2B, the interconnect 140 includes a conductive layer 146, formed on a first side of a substrate (dielectric material) 144, and a conductive layer 142, formed on a second side of the substrate 144. As is shown, a portion of the conductive layer 142 is coupled to a contact 148A, e.g., a conductive post, conductive ball, etc. (collectively referred to herein as a "conductive element"), by a conductive via 143A. With reference to FIG. 1B, another portion of the conductive layer 142 is coupled to a plurality of contacts 148C, via different conductive vias (not separately shown). A different portion of the conductive layer 142 is coupled, by a conductive via 143B, to the conductive layer 146 and contact 148B, e.g. a conductive post, conductive ball, etc. (collectively referred to herein as a "conductive element"). In a typical application, the conductive layer 146 is coupled to the drain of the die 114B. In this case, the contact 148A is utilized to couple a gate of an IC die 114A to a first trace on the substrate 108, which is also coupled to a gate of the IC die 114B. In a similar manner, the contact 148C is utilized to couple a source of the die 114A to a second trace on the substrate 108, which is also coupled to a source of the die 114B.

With reference to FIG. 2A, a signal routing interconnect 120 includes a substrate (dielectric material) 124, which has formed on a second surface a conductive layer 122, which may provide an electromagnetic interference (EMI) shield. A conductive layer 126 is formed on a first side of the substrate 124. A contact 128A, e.g., a conductive post, conductive ball, etc. (collectively referred to herein as a "conductive element"), is coupled to a portion of conductive layer 126. The contact 128A extends from the first side of the substrate and acts to couple a gate of the die 114A to the gate of the die 114B, via the interconnect 140. A drain of the IC die 114A is coupled, by a solder joint 112C, to a second portion of the conductive layer 126. A contact 128B is coupled to the second portion of the layer 126. The contact 128B extends from the first surface of the substrate 124 and couples a drain of the IC die 114A to the drain of the IC die 114B, via the interconnect 140. A source of the die 114A is coupled to the source of the die 114B, in a manner similar to the gate connection between the die 114A and 114B.

According to one embodiment of the present invention, as shown in FIG. 1B, the interconnect 140 includes five drain contacts 148B, a single gate contact 148A and four source contacts 148C. It should be appreciated that interconnects designed according to the present invention may include one or more contacts for each active die contact and may take various forms. As is mentioned above, more than two dies may be stacked in an electronic assembly, configured according to the present invention.

Accordingly, an electronic assembly with stacked dies has been described herein, which shows improved electrical and thermal performance over prior art electronic assemblies with stacked dies.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

What is claimed is:

1. An electronic assembly with stacked integrated circuit (IC) die, comprising:
    a base substrate including an electrically conductive first trace and an electrically conductive second trace formed on a first surface of the base substrate;
    a first IC die having a first side and a second side opposite the first side, wherein the first side of the first IC die includes an electrically conductive first contact and the second side of the first IC die includes an electrically conductive second contact, and wherein the second contact of the first IC die is coupled to the second trace;
    a second IC die having a first side and a second side opposite the first side, wherein the first side of the second IC die includes another electrically conductive first contact and the second side of the second IC die includes another electrically conductive second contact;
    a signal routing first interconnect partially positioned between the first and second IC dies; and
    a signal routing second interconnect partially positioned adjacent the first side of the second IC die, wherein the first interconnect couples the first contact of the first IC die to the first trace and the second contact of the second IC die to the second trace, and wherein the first and second interconnects in combination couple the first contact of the second IC die to the first trace.

2. The assembly of claim 1, wherein the first and second IC dies are field-effect transistors (FETs), insulated-gate bipolar transistors (IGBTs) or power flip-chips.

3. The assembly of claim 1, further comprising:
    a case providing an enclosure for the base substrate, the first and second IC dies and the first and second interconnects.

4. The assembly of claim 3, wherein the case includes an integrated heatsink, and wherein the base substrate is in thermal contact with a portion of the case and the second interconnect is in thermal contact with the heatsink, where the first and second interconnects provide a thermal path between the case and the first and second IC dies.

5. The assembly of claim 1, wherein the first interconnect includes an electrically non-conductive first substrate having a first side and a second side opposite the first side, and wherein a first conductor is formed on the first side of the first substrate and a second conductor is formed on the second side of the first substrate, where the second conductor is coupled to a conductive via that provides the second conductor to the first side of the first substrate, and where different conductive elements extend from the first side of the first substrate to couple the first and second conductors of the first substrate to the first and second traces of the base substrate.

6. The assembly of claim 5, wherein the second interconnect includes an electrically non-conductive second substrate having a first side and a second side opposite the first side, and wherein a first conductor is formed on the first side of the second substrate and a second conductive layer is formed on the second side of the second substrate, where another conductive element extends from the first side of the second substrate to couple the first conductor of the second substrate to the first conductor of the first interconnect.

7. An electronic assembly with stacked integrated circuit (IC) die, comprising:
    a base substrate including an electrically conductive first trace, an electrically conductive second trace and an electrically conductive third trace formed on a first surface of the base substrate;
    a first IC die having a first side and a second side opposite the first side, wherein the first side of the first IC die includes an electrically conductive first contact and the second side of the first IC die includes an electrically conductive second contact and an electrically conductive third contact, and wherein the second contact of the first IC die is coupled to the second trace and the third contact of the first IC die is coupled to the third trace;
    a second IC die having a first side and a second side opposite the first side, wherein the first side of the second IC die includes another electrically conductive first contact and the second side of the second IC die includes another electrically conductive second contact and another electrically conductive third contact;
    a signal routing first interconnect partially positioned between the first and second IC dies; and
    a signal routing second interconnect partially positioned adjacent the first side of the second IC die, wherein the first interconnect couples the first contact of the first IC die to the first trace, the second contact of the second IC die to the second trace and the third contact of the second IC die to the third trace, and wherein the first and second interconnects in combination couple the first contact of the second IC die to the first trace.

8. The assembly of claim 7, wherein the first and second IC dies are field-effect transistors (FETs).

9. The assembly of claim 7, wherein the first and second IC dies are insulated-gate bipolar transistors (IGBTs).

10. The assembly of claim 7, wherein the first and second IC dies are power flip-chips.

11. The assembly of claim 7, further comprising:
    a case providing an enclosure for the base substrate, the first and second IC dies and the first and second interconnects.

12. The assembly of claim 11, wherein the case includes an integrated heatsink, and wherein the base substrate is in thermal contact with a portion of the case and the second interconnect is in thermal contact with the heatsink, where the first and second interconnects provide a thermal path between the case and the first and second IC dies.

13. The assembly of claim 7, wherein the first interconnect includes an electrically non-conductive first substrate having a first side and a second side opposite the first side, and wherein a first conductor is formed on the first side of the first substrate and second and third conductors are formed on the second side of the first substrate, where the second and third conductors are coupled to different vias that provide the second and third conductors to the first side of the first substrate, and where different conductive elements extend from the first side of the first substrate to couple the first, second and third conductors of the first substrate to the first, second and third traces of the base substrate.

14. The assembly of claim 13, wherein the second interconnect includes an electrically non-conductive second substrate having a first side and a second side opposite the first side, and wherein a first conductor is formed on the first side of the second substrate and a second conductive layer is formed on the second side of the second substrate, where another conductive element extends from the first side of the second substrate to couple the first conductor of the second substrate to the first conductor of the first interconnect.

15. An electronic assembly with stacked integrated circuit (IC) die, comprising:
- a base substrate including an electrically conductive first trace, an electrically conductive second trace and an electrically conductive third trace formed on a first surface of the base substrate;
- a first IC die having a first side and a second side opposite the first side, wherein the first side of the first IC die includes an electrically conductive first contact and the second side of the first IC die includes an electrically conductive second contact and an electrically conductive third contact, and wherein the second contact of the first IC die is coupled to the second trace and the third contact of the first IC die is coupled to the third trace;
- a second IC die having a first side and a second side opposite the first side, wherein the first side of the second IC die includes another electrically conductive first contact and the second side of the second IC die includes another electrically conductive second contact and another electrically conductive third contact;
- a signal routing first interconnect partially positioned between the first and second IC dies;
- a signal routing second interconnect partially positioned adjacent the first side of the second IC die, wherein the first interconnect couples the first contact of the first IC die to the first trace, the second contact of the second IC die to the second trace and the third contact of the second IC die to the third trace, and wherein the first and second interconnects in combination couple the first contact of the second IC die to the first trace; and
- a case providing an enclosure for the base substrate, the first and second IC dies and the first and second interconnects.

16. The assembly of claim 15, wherein the first and second IC dies are one of field-effect transistors (FETs), insulated-gate bipolar transistors (IGBTs) or power flip-chips.

17. The assembly of claim 15, wherein the case includes an integrated heatsink, and wherein the base substrate is in thermal contact with a portion of the case and the second interconnect is in thermal contact with the heatsink, where the first and second interconnects provide a thermal path between the case and the first and second IC dies.

18. The assembly of claim 15, wherein the first interconnect includes an electrically non-conductive first substrate having a first side and a second side opposite the first side, and wherein a first conductor is formed on the first side of the first substrate and second and third conductors are formed on the second side of the first substrate, where the second and third conductors are coupled to different vias that provide the second and third conductors to the first side of the first substrate, and where different conductive elements extend from the first side of the first substrate to couple the first, second and third conductors of the first substrate to the first, second and third traces of the base substrate.

19. The assembly of claim 18, wherein the second interconnect includes an electrically non-conductive second substrate having a first side and a second side opposite the first side, and wherein a first conductor is formed on the first side of the second substrate and a second conductive layer is formed on the second side of the second substrate, where another conductive element extends from the first side of the second substrate to couple the first conductor of the second substrate to the first conductor of the first interconnect.

* * * * *